(12) United States Patent
Vashchenko et al.

(10) Patent No.: US 7,022,532 B1
(45) Date of Patent: Apr. 4, 2006

(54) METHOD OF MAKING SPIN-INJECTION DEVICES ON SILICON MATERIAL FOR CONVENTIONAL BICMOS TECHNOLOGY

(75) Inventors: Vladislav Vashchenko, Palo Alto, CA (US); Michael Mian, Livermore, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/216,980

(22) Filed: Aug. 31, 2005

Related U.S. Application Data

(62) Division of application No. 10/743,845, filed on Dec. 22, 2003, now Pat. No. 6,963,091.

(51) Int. Cl.
*H01L 21/00* (2006.01)

(52) U.S. Cl. .......................................... 438/3; 438/308

(58) Field of Classification Search ................... 438/3, 438/308
See application file for complete search history.

(56) References Cited

U.S. PATENT DOCUMENTS 6,753,562 B1    6/2004   Hsu et al. ................... 257/295

*Primary Examiner*—Evan Pert
(74) *Attorney, Agent, or Firm*—Stallman & Pollock LLP

(57) ABSTRACT

Spin-based microelectronic devices can be realized by utilizing ferromagnetic structures that make good ohmic contact with silicon, in order to avoid the Schottky barrier problem plaguing existing approaches to spin-based microelectronics, while allowing the devices to be based on silicon substrates, which are well-known and used in the industry. Thin layers of metal silicide, such as $CoSi_2$ and $NiSi_2$, are used as an intermediate layer between ferromagnetic contacts, such as cobalt and nickel contacts, and the silicon substrate. The thin silicide layers provide good ohmic contact between the ferromagnetic contacts and silicon, such that spin-polarized carriers can be injected into the silicon, and detected out of the silicon, without loss of spin polarization.

8 Claims, 8 Drawing Sheets

- prior art -

METHOD OF MAKING SPIN-INJECTION DEVICES ON SILICON MATERIAL FOR CONVENTIONAL BICMOS TECHNOLOGY

CLAIM OF PRIORITY

This application is a divisional of U.S. patent application Ser. No. 10/743,845, entitled "SPIN-INJECTION DEVICES ON SILICON MATERIAL FOR CONVENTIONAL BiCMOS TECHNOLOGY," filed Dec. 22, 2003 now U.S. Pat. No. 6,963,091, which is hereby incorporated herein by reference.

TECHNICAL FIELD OF THE INVENTION

The present invention relates to the use of spin-injection in silicon-based microelectronic devices.

DETAILED DESCRIPTION

Figure 1:
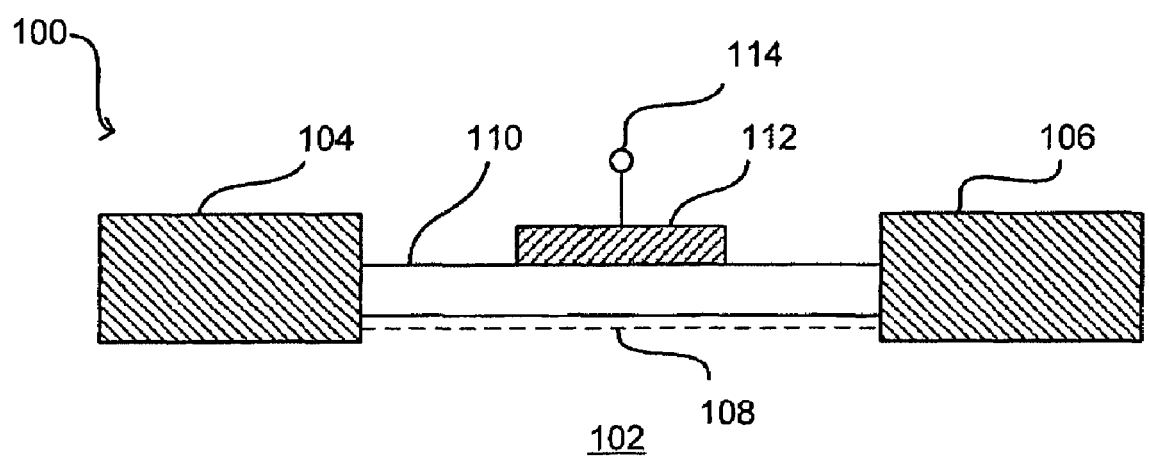
FIG. 1 is a diagram of a proposed spin-FET in accordance with one approach of the prior art.

As demands placed on semiconductor devices continue to increase, there is a corresponding need for higher density devices having feature sizes that push further into the submicron level. In order to address the necessary increases in density, design engineers have begun to look to the quantum level, designing devices known in the industry as spin-based electronic or "spintronic" devices. Spintronic devices utilize the spin of an electron, rather than simply relying on the movement of charge through a device. There is a magnetism associated with the angular momentum or spin of an electron, and the energy of the electron in a magnetic field depends on the orientation of a spin "vector" associated with the spin. While each electron has the same amount of spin, electron spins have vectors pointing in random directions in an ordinary electric current. These random directions do not affect the resistance of the circuit or device containing the current.

When these electrons are exposed to a magnetic field, the electron spin vectors tend to orient themselves either parallel or anti-parallel to the magnetic field. This effect is referred to as the electrons having either a spin "up" or spin "down," referring to the vector associated with the spin of each electron as is known in the art. Further, the electrons in a ferromagnet tend to "align" themselves with adjacent electrons such that the spin vectors on average point in the same direction. Electrons having a spin up or spin down can be easiest understood as being said to have axes of rotation that are parallel, but that have opposing directions of rotation. When a flow of current passes through a ferromagnet, electrons of the same spin orientation as the ferromagnet tend to flow freely, while electrons of the opposite spin tend to be obstructed. The result is a current comprised of electrons having predominantly the same spin orientation.

Presently, people are utilizing magnetics and the magnetoresistive effect in areas such as high density hard drives. Such technology utilizes thin films for high density recording using a magnetic recording head, acting as a spin valve, instead of coils for charge detection as was done previously. The utilization of thin films allows devices to move to the micro- or nano-scale. Existing charge-based electronics typically ignore the spin of the electrons in the current flow. A rapid pace of discoveries based on the Giant Magnetoresistive Effect (GMR) has virtually revolutionized the multi-billion dollar industry of magnetic hard drives, introducing affordable high-density drives (HDD). Recent discoveries in this area have made further progress, pushing the magnetic recording industry on the order of four times beyond the previously-acknowledged physical limit. In another new class of devices, magnetic memory is commercially available that is based on GMR concepts. Information on GMR can be found through many sources, such as at the IBM Research Web site.

A huge amount of research activity also has been devoted to the creation of other spin-based devices. The potential for microelectronics with spin-dependent effects includes rapid progress in non-volatility, data processing speed, electric power consumption, integration densities, and the development of totally new devices such as spin-FETs, spin-LEDs, spin-RTDs, optical switches, terahertz frequency modulators, and quantum bits. Complex problems exist, however, that must be addressed and overcome before such semiconductor spin-based devices can be realized. These problems include, for example: transport across hetero-interfaces, optimization of electron spin lifetimes, and the detection of spin coherence.

One device that has been proposed is a spintronic field-effect transistor (FET) as shown in FIG. 1. As in a conventional FET, a voltage from a voltage contact 114 is applied to a gate electrode 112 positioned above a semiconductor channel located between a source electrode 104 and a drain electrode 106. In a conventional FET, the applied voltage can cause electrons flowing between the source and the drain to be driven out of the semiconductor channel, thereby creating an insulator out of the channel. In a proposed spintronic FET, or "spin" FET, a ferromagnetic material such as iron can be used to form both the source 104 and the drain 106 of the FET device, such that current flowing through the semiconductor channel, such as along path 108, is primarily spin-polarized. In these previously proposed spin-FET devices, the substrate is not a simple silicon substrate as is commonly utilized and is well-known in the industry. Instead, various dopants are utilized in the substrate 102 and/or the intermediate layer 110 in order to attempt to obtain a working device, the dopants including, for example, indium, aluminum, arsenic, and gallium.

Spintronic devices such as spin FETs have yet to be fully realized, however, as injecting a spin-polarized current from a ferromagnetic material into a semiconductor material such as silicon has proven to be extremely difficult. The flow of electrons between such materials creates a Schottky-barrier type problem, or Schottky contact as is known in the art, wherein the transport of carriers through a Schottky contact changes the spin polarization of those carriers. In an attempt to avoid these difficulties, research currently is being done to create magnetic semiconductors by doping semiconductor crystals, such as by doping silicon with materials such as manganese. While such devices may eventually prove to be effective, such an approach would require a fundamental change in the way semiconductors are designed and manufactured, as the industry as a whole is based on silicon wafers. While magnetic semiconductors may have problems or aspects which are presently undiscovered, silicon is well-studied and well-known. It is therefore desirable to develop a spintronic device using a standard silicon wafer or silicon substrate, along with existing semiconductor processes and devices.

Systems and methods in accordance with embodiments of the present invention can overcome these and other deficiencies in existing spintronic approaches to microelectronic devices by utilizing novel magnetic contact structures that provide good ohmic contact with materials such as silicon, such that the contact can inject spin-polarized carriers into silicon without significant loss of spin polarization. These magnetic contact structures also can change resistivity in order to detect spin-polarized carriers flowing through a channel between the contact structures. Such devices do not require the formation and inclusion of p-n junctions, and are capable of conducting current at a very low voltage. These devices can work at voltages on the order of a fraction of a volt, such as on the order to a few kT for good ohmic contact devices (where 1 kT=0.024 V at 300 K). In actual use, there can be some parasitic voltage drop in the devices.

As discussed above, current flowing from a ferromagnetic source contact will have a primary spin polarization, or a non-equal distribution of carriers polarized in a particular direction. The proportion of carriers polarized in the particular direction, as well as the particular direction itself, can depend on factors such as the structure and purity of the contact and the presence or application of a magnetic field. If a ferromagnetic drain contact has the same spin orientation as the source contact, the spin-polarized current will tend to flow easily from the source, through the semiconductor channel, and into the drain. Applying a voltage to the gate electrode can create an electric field across the semiconductor channel. The electric field will appear to the flowing electrons as a magnetic field according to Maxwell's equations, as is known in the art. This apparent magnetic field can cause many of the spins to "flip," such as going from spin "up" to spin "down." Once flipped, the majority of the electrons will not easily flow into the drain, or will be substantially inhibited from flowing into the drain, as the electrons will have the opposite spin polarization to the ferromagnetic drain contact. This can create an insulating effect, similar to the application of a gate voltage in a standard FET. A spin FET can have many advantages over a conventional FET, however, as changing the spin polarization of an electron takes much less energy and can be done much more quickly than forcing the same electron out of a semiconductor channel.

In order to avoid Schottky barrier problems, yet still be able to use standard semiconductor technology such as silicon wafers, contact structures can be utilized that make good ohmic contact with silicon. "Ohmic contact" is a type of boundary condition that provides a path for current flow, wherein the spin-orientation of electrons in the current flow can be maintained when passing through the boundary, providing for spin-polarized carrier injection. Materials such as titanium silicide ($TiSi_2$), cobalt silicide ($CoSi_2$), and nickel silicide ($NiSi_2$) can create near-perfect ohmic contact with silicon, but have not been demonstrated to be ferromagnetic or capable of serving as a contact in such a device. Cobalt and nickel are both magnetic while having all the desirable properties of a metal. Embodiments in accordance with the present invention can take advantage of these properties by utilizing an intermediate silicide layer to provide ohmic contact between a magnetic material or ferromagnet, such as cobalt or nickel, and a silicon substrate or silicon body.

Figure 2:
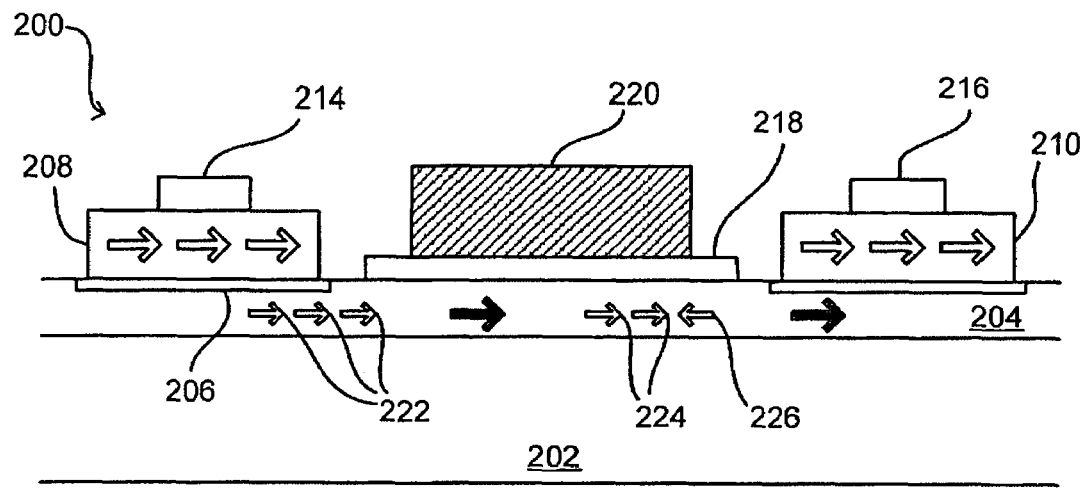
FIG. 2 is a diagram of a spintronic device in accordance with one embodiment of the present invention.

As shown in the exemplary spintronic device 200 of FIG. 2, an injection contact 208 and a detection contact 210 are each positioned on a thin layer of silicide 206 overlying a silicon substrate 202. The thin layer of silicide allows for the injection of spin-polarized carriers into the silicon substrate without significant loss of spin polarization. The silicon substrate can have a layer of carrier material 204, such as for example an n-well in a p-substrate as is known in the art. The injection and detection contacts 208, 210 can be made of a ferromagnetic metal, such as cobalt, nickel, or iron, and in this example have a common spin polarization that is parallel to the surface of the silicon substrate. The magnetization of each contact 208, 210 can depend on the thickness of the contact, as the crystal structure of the contact can provide for ferromagnetic spin orientation during deposition, for example. An external magnetic field also can be applied to each contact in order to program the spin orientation of that contact. In another embodiment, at least one additional metal layer can be used to provide for proper contact anisotropy. Each additional metal layer can be a thin film of a diamagnetic or antiferromagnetic metal, such as for example a layer of ruthenium (Ru). The additional layer(s) can be placed between the contact and the silicide layer, and/or on top of the contact, in order to provide for the proper spin orientation in the contact.

Each ferromagnetic contact has a plug 214, 216 positioned thereon, such that the contact can be placed in communication with an overlying metal layer (not shown) as is known in the art. The silicide layers 206 can be sufficiently thin such that spin-polarized carriers 222 can be injected into the carrier layer 204, and can flow into contact 210, without losing spin polarization. The silicide layers can be formed having only a few atomic layers in order to obtain adequate spin injection. For example, $CoSi_2$ can be deposited on the order of about 300 nm in thickness, while $NiSi_2$ can be deposited with a thickness on the order of 30 nm, or about three atomic layers. A gate electrode or polygate 220, positioned on an oxide layer 218 overlying the silicon substrate 202, can apply an electrical field across a semiconductor channel in the carrier layer 204 between the injection contact 208 and detection contact 210. The gate electrode, along with circuitry necessary to apply the electric field to the channel, functions as a control mechanism capable of providing control over the spin polarization of injected carriers 222, 224, 226 flowing through the semiconductor channel.

Figure 3:
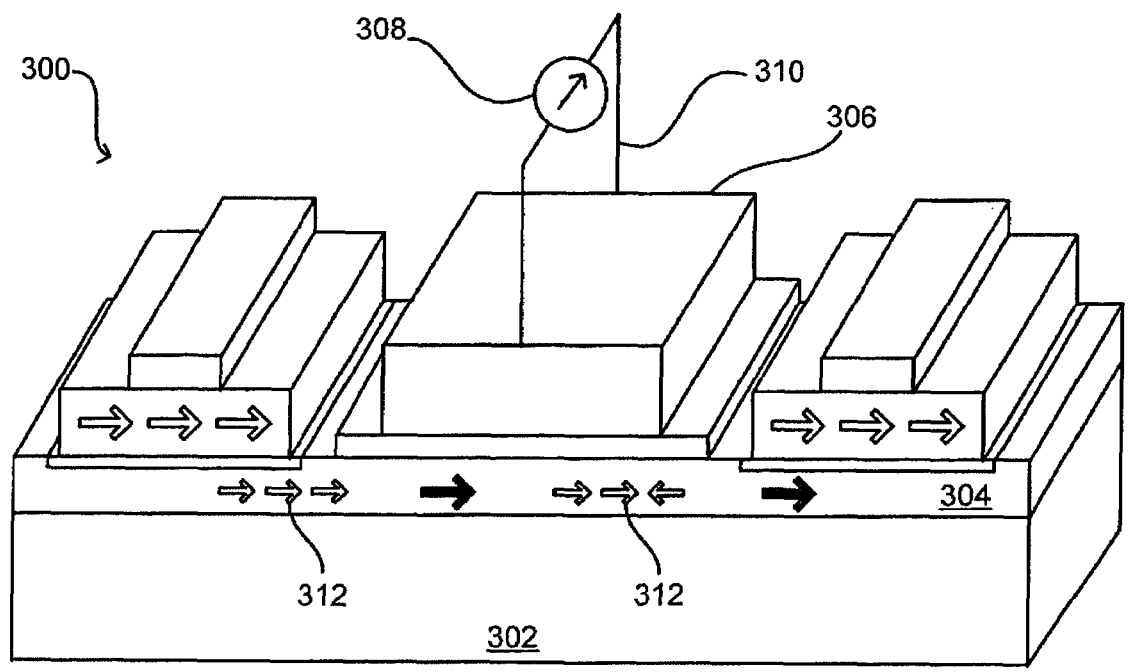
FIG. 3 is a perspective view of another spintronic device in accordance with the embodiment of FIG. 2.

For example, with respect to the device 300 of FIG. 3, a voltage can be applied to the field electrode 306. The resulting electric field across the channel in the carrier layer 304 between the contacts can cause the spin-polarized carriers 312 to tend to "flip" spin. The change in spin can result in spin precession, as well as corresponding changes in the resistivity of the detection magnetic contact. The current across the field electrode 306 can be monitored using a galvanometer 308 or other sensitive current meter in communication with the field electrode 306 through contact 310.

Figure 4A:
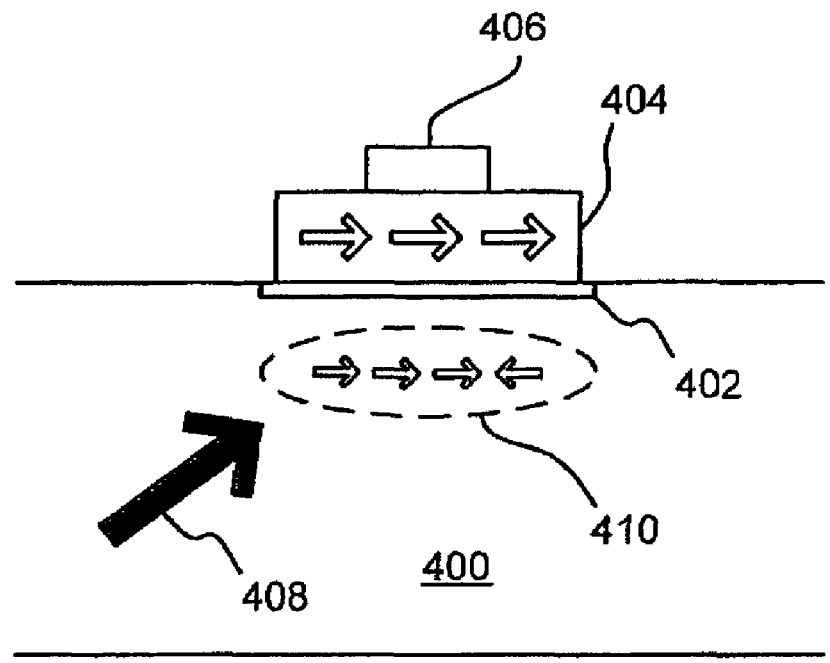
FIG. 4 is a diagram of a detection structure in accordance with the embodiment of FIG. 2.
Figure 4B:
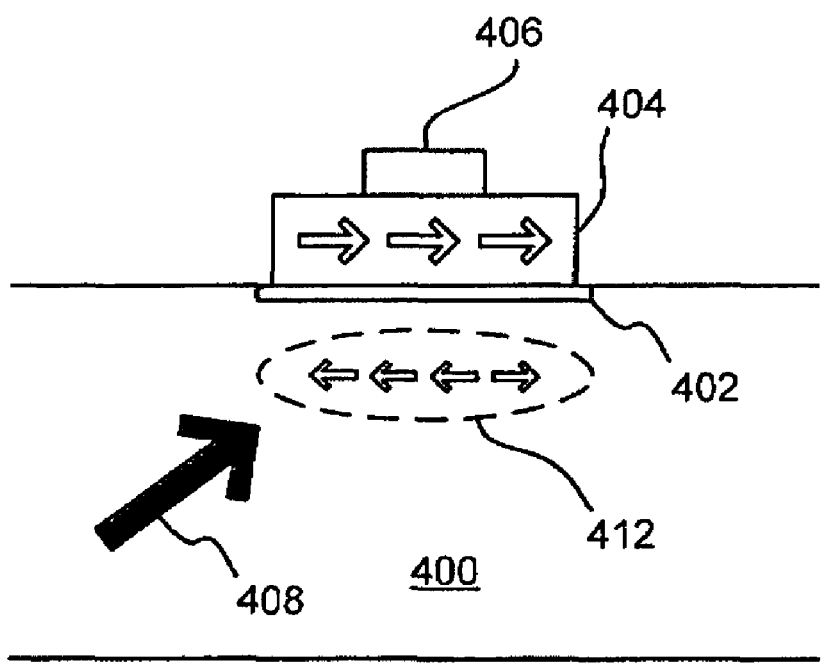
Figure 5A:
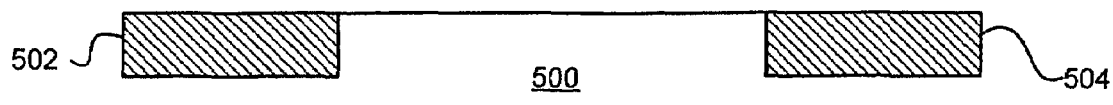
FIG. 5 is a diagram showing a device formation process of the prior art.
Figure 5B:
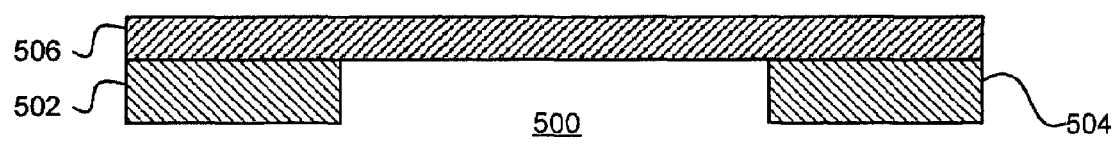
Figure 5C:
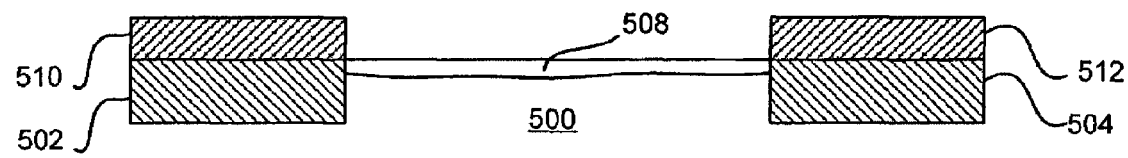
Figure 5D:
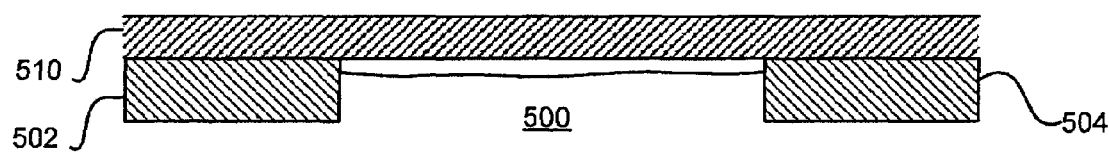
Figure 5E:
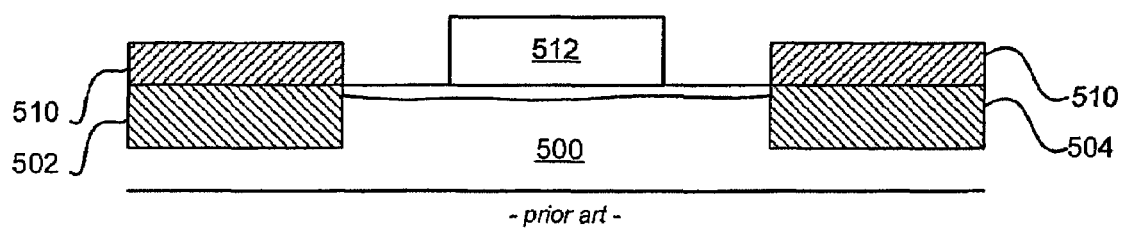
Figure 6A:
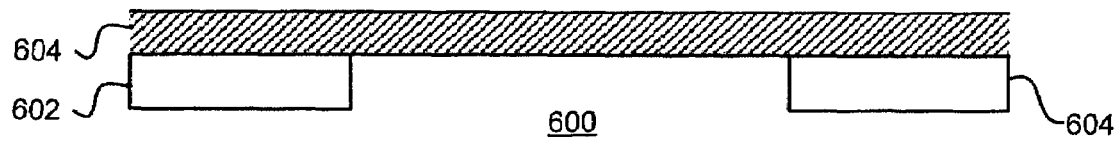
FIG. 6 is a diagram showing a device formation process in accordance with one embodiment of the present invention.
Figure 6B:
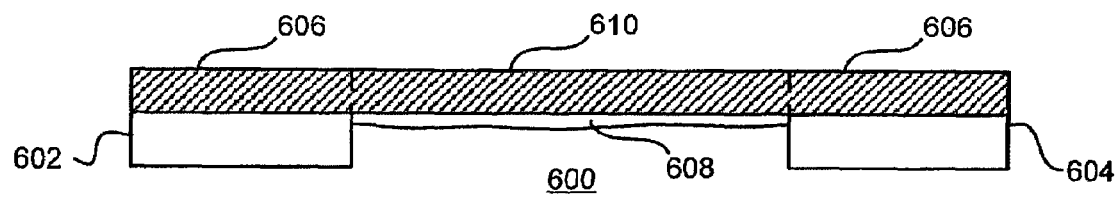
Figure 6C:
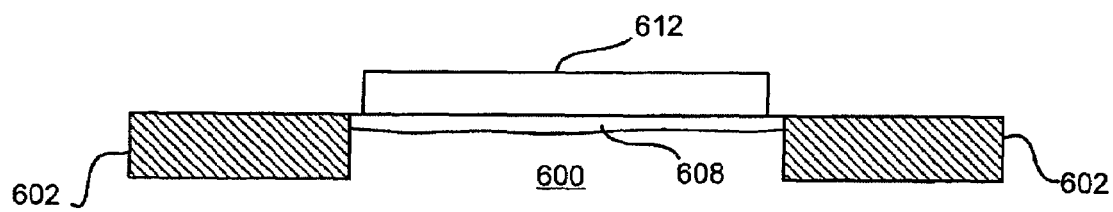
Figure 6D:
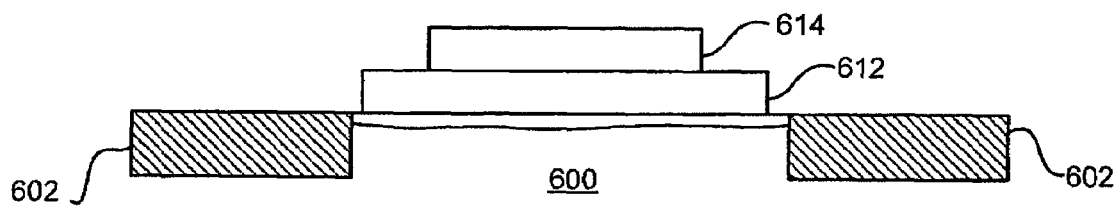

The spin polarization of the carriers can affect the resistance of the detection contact 404, as shown in FIG. 4. As seen in FIG. 4(a), when the spin of the carriers 410 is primarily the same as the spin polarization of the detection contact 404, the detection contact will have low resistance and current will easily flow through the silicide layer 402 and into the detection contact 404 along current flow direction 408. As shown in FIG. 4(b), when the primary spin of the carriers 412 is opposite to, or orthogonal to, the spin polarization of the detection contact 404, the detection contact will have a higher resistance and current will not as easily flow into the detection contact. When carriers are primarily spin polarized in another direction, such as at an angle to the spin orientation of the detection contact 404, the effective resistance of the detection contact can vary but current can still flow into the detection contact 402. The direction of current flow 408 shown in the device is exaggerated, as the angle of approach of the current to the detection contact 404 actually can be a relatively small angle.

Many control methods are known for applying an electric field to a channel in a semiconductor device such as a FET. Many of these control methods can be applied to spin FETs and other devices on silicon in accordance with embodiments of the present invention. Similar devices can be created using different approaches to controlling the spin polarization of the injected carriers. In one such device, a magnetic transistor can be created using a nanowire polygate to provide and control a magnetic field that can be used to control the spin polarization of the carriers. In another such device, a ferromagnetic gate can be used that has an opposite spin polarization to the contacts, such that the application of a voltage to the gate can cause injected carrier passing by the gate to align spin with the gate, thereby increasing the effective resistance of the detection contact. These devices also can include other components, such as magnetic sensors, and can be positioned near an associated integrated circuit.

Processes for Device Formation

In a typical process for an existing device such as a FET device, a silicide can be formed on the silicon wafer to serve as an interface between the silicon and, for example, a tungsten plug used to create an interconnect region to a metal level of the semiconductor. Silicide layers, particularly layers of self-aligned silicide, have been used in devices such as high-performance CMOS devices. These silicide layers can provide a low sheet resistance of source, drain, and gate electrode areas, minimizing RC delays and enabling high-speed operation. Such suicides also can be used to create stable contacting structures of low resistance, thereby minimizing source/drain resistance and optimizing device performance. A metal such as titanium is typically deposited on a silicon surface and annealed in order to form the silicide layer. The entire metal layer is reacted with the silicon and transformed into a silicide.

Processes used to react metals such as titanium with silicon are well known in the art. Any unnecessary metal or metal silicide left on the surface is then etched away. Contacts such as tungsten plugs are then mated to, or deposited on, the metal silicide in order to act as contacts for the source and drain regions.

In an existing process, such as that shown in the example of FIG. 5, a substrate such as a silicon wafer 500 undergoes a shallow trench isolation (STI) process, wherein trenches are created in the wafer surface, such as by a dry-etch step, which are filled with silicon oxide, such as through use of a chemical vapor deposition (CVD) process. After the overlying oxide is stripped from the surface, the trenches are filled with isolation regions 502, 504 of silicon oxide with an area of silicon between them for transistor formation, for example. As is known in the art, any necessary p-n junctions are formed in the area of silicon between the isolation regions 502, 504. It is then necessary to place contacts on the surface. A layer of metal 506, such as a layer of titanium, is deposited onto the surface of the device. The layer is then annealed for the proper amount of time and at the proper temperature, such that there is a full reaction of the metal layer with the silicon. The reaction forms an area of titanium silicide 512 between the isolation regions, where the titanium was directly in contact with the area of exposed silicon. Some residual areas of titanium 508 still remain on the surface above the isolation regions, but these residual areas are not magnetic as a result of the reaction. The remaining titanium is stripped, and an oxide layer 510 is deposited on the surface. An area is then opened up in the oxide layer 510 and a contact such as a tungsten plug 512 is deposited.

In processes in accordance with various embodiments of the present invention, it is desirable to react the metal layer with silicon to form a metal silicide layer, but it is also desirable to have a contact area of unreacted metal on the metal silicide layer capable of operating as a ferromagnet. In order to obtain a layer of unreacted metal on a layer of reacted metal, either only a portion of the metal can be reacted during the appropriate anneal step, or a second layer of metal can be deposited on the layer of metal silicide. A layer of unreacted metal can be needed for the metal to have all the necessary properties of a ferromagnet.

Figure 7:
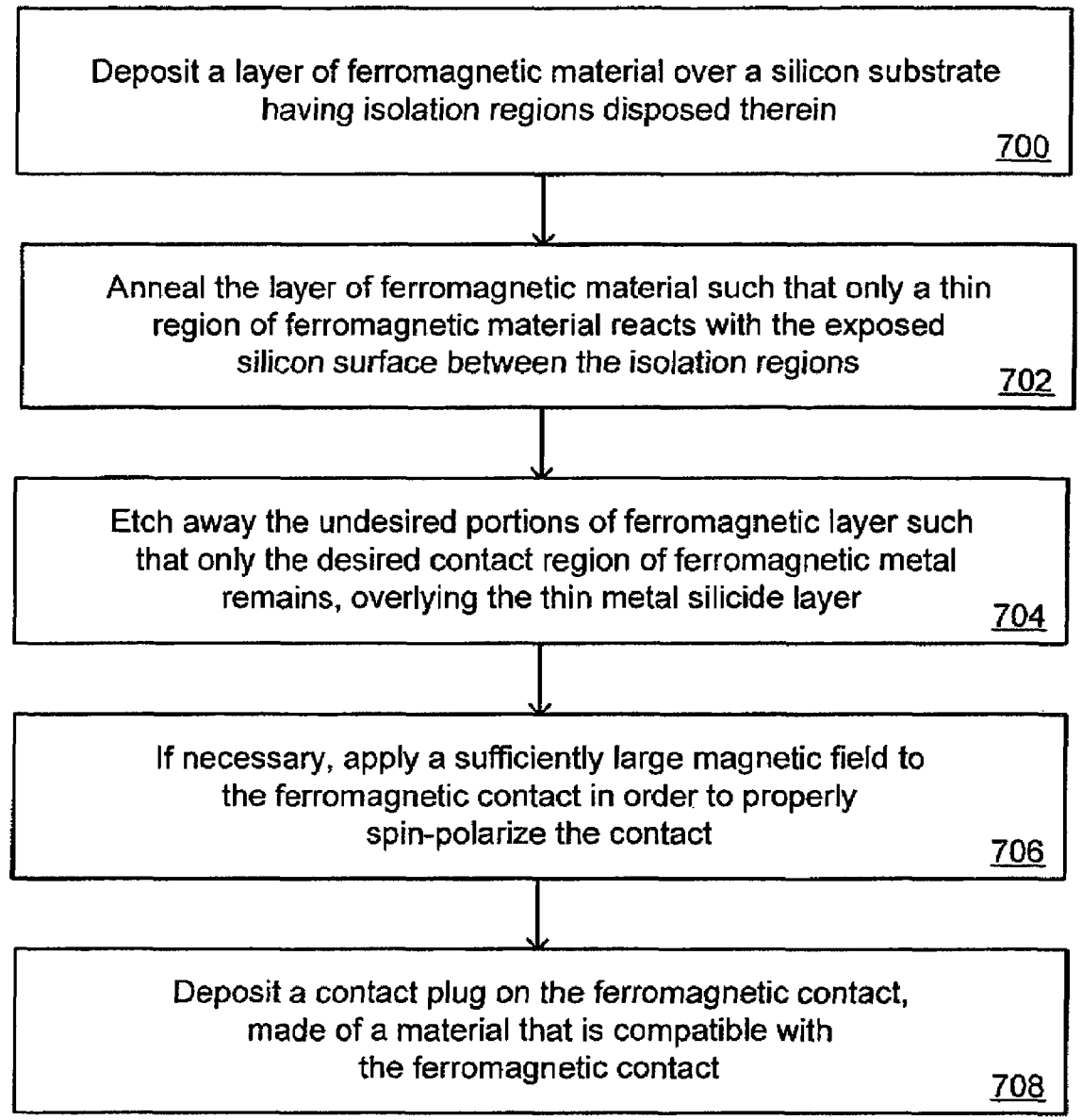
FIG. 7 is a flowchart for the process of FIG. 6.
Figure 8A:
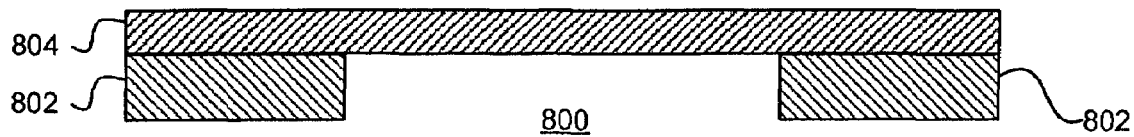
FIG. 8 is a diagram showing a device formation process in accordance with another embodiment of the present invention.
Figure 8B:
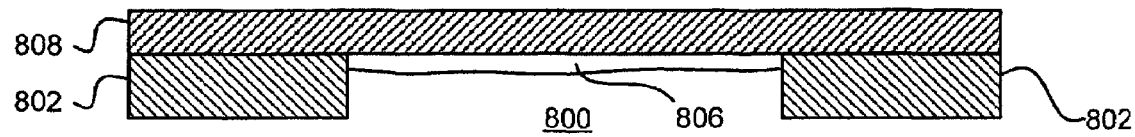
Figure 8C:
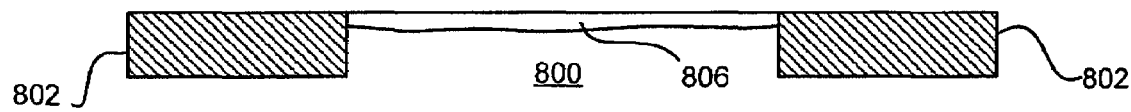
Figure 8D:
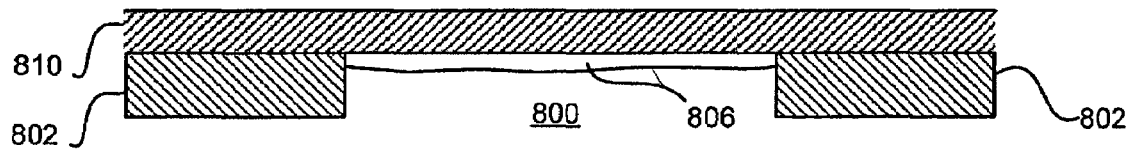
Figure 8E:
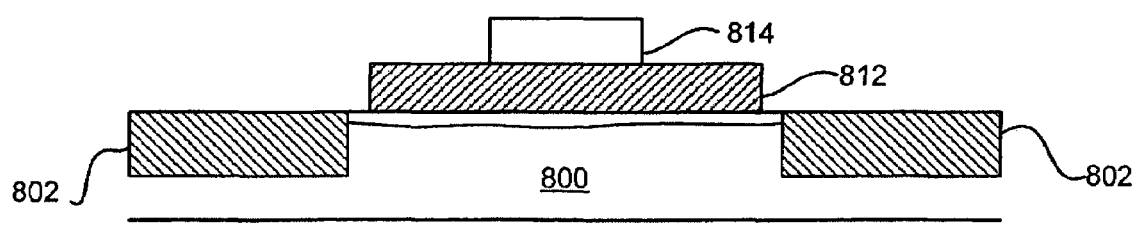

An example of one such process is shown in FIG. 6. In FIG. 6(a), STI isolation regions 602 are formed in a silicon substrate 600, as discussed above with respect to FIG. 5. A layer of ferromagnetic metal 604 such as cobalt or nickel, or even titanium, is deposited on the surface. As seen in FIG. 6(b) an anneal step is controlled such that only a portion of the ferromagnetic metal reacts with the silicon, with the reaction occurring between the isolation regions 602. The anneal step should be precisely controlled, as cobalt is highly reactive and otherwise can fully react with the silicon. The result is a thin layer of metal silicide 608 between the layer of ferromagnetic metal 610 and the exposed silicon. Residual regions of ferromagnetic material 606 can remain on the surface. As seen in FIG. 6(c), a cobalt etch can take place, such that the residual areas of ferromagnetic material are removed, leaving only the desired contact region 612 of ferromagnetic metal overlying the thin metal silicide layer 608. As seen in FIG. 6(d), a compatible plug then can be placed on the surface of the ferromagnetic metal. Depending on the deposition and anneal processes, it can be necessary to apply a sufficiently large magnetic field can be applied to the ferromagnetic contact 612 in order to spin-polarize the contact, such that carriers injected into the silicon from the contact will have the desired spin orientation. With thin layers of ferromagnetic material, the spin can orient itself parallel to the surface boundary between the silicide and the contact. Knowing the crystal structure of the underlying silicon, careful control of the deposition and anneal processes can allow the silicide and contact layers to be oriented such that the desired spin orientation can be obtained without the need for an external magnetic field. FIG. 7 shows exemplary steps for one such process.

Figure 9:
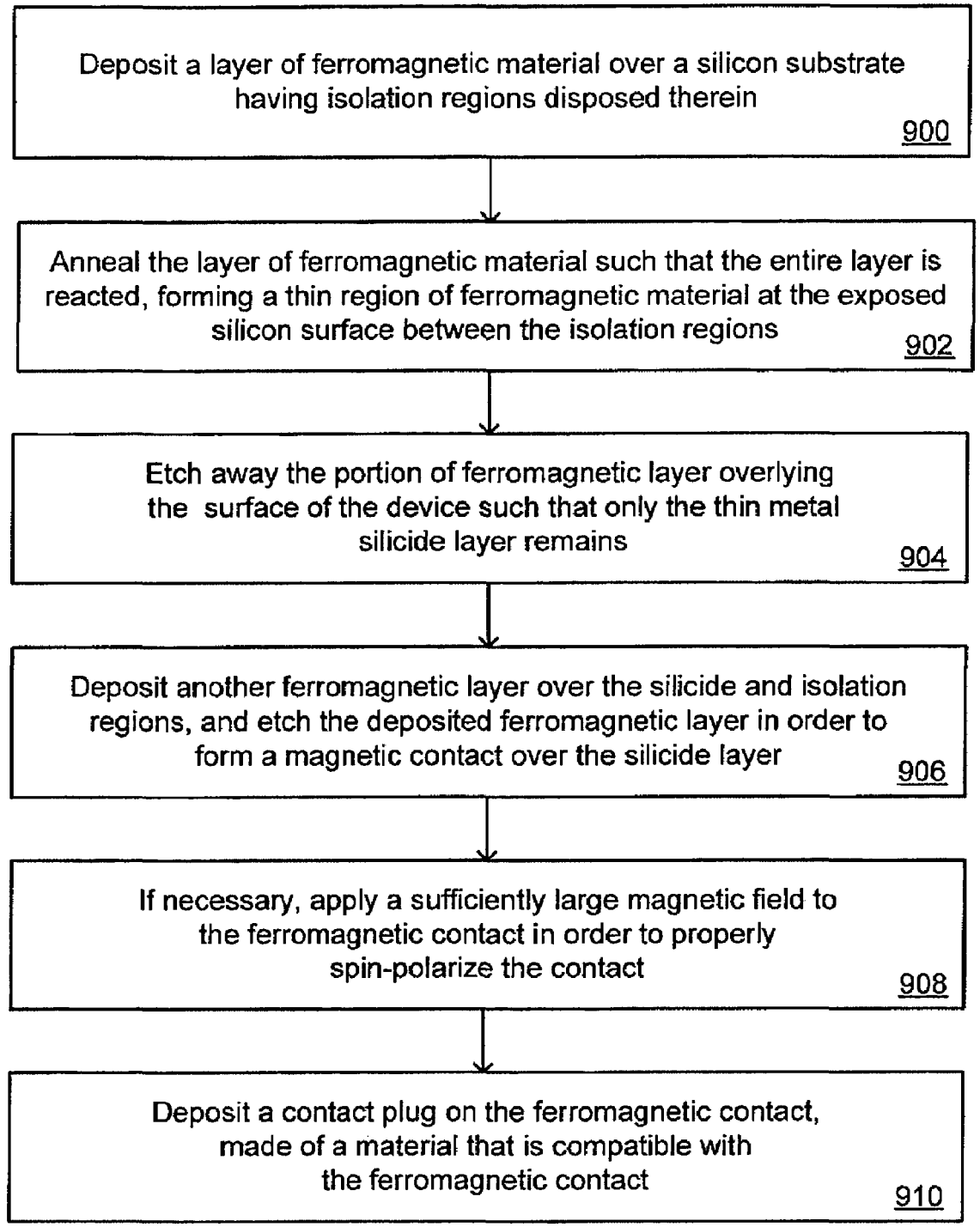
FIG. 9 is a flowchart for the process of FIG. 8.

An example of another such process is shown in FIG. 8. As seen in FIG. 8(a), STI regions 802 are again formed in the silicon substrate 800, with a layer of ferromagnetic material 804 deposited on the surface, as described with respect to FIG. 6(a). As seen in FIG. 8(b), an anneal step can be used to react the entire layer of ferromagnetic material to form a layer of reacted metal 808, with a region of metal silicide 806 being formed between the isolation regions in the silicon substrate 800. FIG. 8(c) shows the device after a metal etch, in which the layer of reacted metal overlying the surface is removed. As seen in FIG. 8(d), another layer of ferromagnetic material 810 is deposited on the surface, over the metal silicide 806 and the isolation regions 802. The additional layer of ferromagnetic material can be of the same material as the first ferromagnetic layer, or of a different material. For instance, if cobalt was deposited and annealed to form a layer of $CoSi_2$, the additional layer of ferromagnetic material could be a layer of cobalt, or it could be a layer of, for example, nickel or iron. Depending on the process and parameters, a very slight anneal may be needed in order to stabilize the additional layer of ferromagnetic material 810 and/or to get the spin polarization to properly align. As seen in FIG. 8(e), another metal etch step can be used to remove the unwanted portions of the metal layer overlying the surface, such that a ferromagnetic metal contact 812 is formed over the thin layer of silicide 806. A compatible plug 814 such as a tungsten plug then can be placed on the ferromagnetic contact 812. As discussed above with respect to FIG. 5, a sufficiently large magnetic field can be applied to the ferromagnetic contact 812 in order to spin-polarize the contact, if necessary, such that carriers injected into the silicon from the contact will have the desired spin orientation. Also as discussed above, additional diamagnetic and/or anti-ferromagnetic metal layers can be used above and/or below the contact to control the anisotropy of the contact. FIG. 9 shows exemplary steps for one such process.

Depending on the process, certain materials can function better in different situations. For example, cobalt might be utilized advantageously in certain systems for both the injection and detection contacts in the device, as the layers might be similarly spin-polarized during the formation process. Alternatively, it might be advantageous in certain devices and processes to utilize separate deposition, etch, and anneal processes for the injection and detection contacts, such that cobalt can be used for one contact and nickel can be used for the other contact if one metal should prove better for injection and the other prove better for detection. Using different materials for the contacts also can be used where the spins of the contacts are desired to be at an "angle," in order to get the appropriate resistance. In such a situation, different materials can be used where one material can easily be deposited with spins parallel to the surface boundary and one material is easily deposited with spins orthogonal to the surface boundary. It might also prove beneficial to utilize a particular silicide layer independent of the contact material. For example, a nickel silicide layer might be formed that is much thinner than can be formed for a cobalt silicide, such that it might be advantageous to utilize nickel silicide with either a cobalt or nickel contact.

Processes such as those shown in FIGS. 6–9 can allow magnetic junctions to be positioned in the desired locations on a semiconductor device with relative ease, and using primarily exiting technology for the device. The anneal process used to generate the silicide layer can be tuned to create a silicide layer that is as thin as possible, in order to not only create the desired ohmic contact but to reduce scattering of the spin-polarized carriers on injection and/or detection. The layer of material used to create the silicide can be masked in order to produce individual ferromagnetic contacts, or can be masked in order to create a bulk ferromagnetic region. A bulk ferromagnetic region can be used in cases where individual, local regions might be difficult to fabricate. A surface contact or plug can be deposited onto each ferromagnetic contact, such that each ferromagnetic contact can be connected to the backend layers of the semiconductor device. Once each ferromagnetic contact is in place the contact can have an appropriate polarization, due in part to the thinness of the layer. Depending on the process, a cobalt or nickel contact might have a consistent spin polarization when deposited on the silicon. In such a case, both the source and drain would have the same spin polarization and could easily be used in the device. Otherwise, an external magnetic field can be used to polarize each ferromagnet in a desired orientation. Further, the semiconductor device can be designed such that a magnetic field can be applied on-chip in order to adjust the spin polarization of contacts. A heavily doped channel layer also can be provided at an early step in the process where necessary.

It should be recognized that a number of variations of the above-identified embodiments will be obvious to one of ordinary skill in the art in view of the foregoing description. Accordingly, the invention is not to be limited by those specific embodiments and methods of the present invention shown and described herein. Rather, the scope of the invention is to be defined by the following claims and their equivalents.

What is claimed is:

1. A method for forming a contact for a spin-based device, comprising:
   depositing a first ferromagnetic metal layer on a silicon substrate;
   annealing the first ferromagnetic metal layer to form a layer of metal silicide, the layer of metal silicide having a thickness allowing the layer to act as a tunneling junction for spin-polarized carriers; and
   forming a second ferromagnetic layer on the layer of metal silicide, the second ferromagnetic layer operable as a ferromagnetic contact capable of injecting spin-polarized carriers through the layer of metal silicide into the silicon substrate without loss of spin polarization.

2. A method according to claim 1, wherein:
   annealing the ferromagnetic metal layer to form a layer of metal silicide includes annealing a first portion of the first ferromagnetic metal layer, the metal silicide being in contact with the silicon layer, and
   forming a second ferromagnetic layer includes not annealing a second portion of the first ferromagnetic layer in order to form a ferromagnetic metal contact, the ferromagnetic metal contact overlying the layer of metal silicide and capable of injecting spin-polarized carriers through the layer of metal silicide into the silicon substrate without loss of spin polarization.

3. A method according to claim 1, wherein:
   forming a second ferromagnetic layer includes depositing a second ferromagnetic metal layer on the layer of metal silicide, the second ferromagnetic layer operable as a ferromagnetic contact capable of injecting spin-polarized carriers through the layer of metal silicide into the silicon substrate without loss of spin polarization.

4. A method according to claim 1, further comprising:
   etching the layer of metal silicide to remove any unnecessary metal silicide.

5. A method according to claim 1, further comprising:
   applying a magnetic field to the second ferromagnetic layer in order to control the spin-polarization of the second ferromagnetic layer.

6. A method according to claim 1, wherein:
annealing the first ferromagnetic metal layer to form a layer of metal silicide and forming a second ferromagnetic layer on the layer of metal silicide forms a source electrode for injecting spin-polarized carriers through the layer of metal silicide into the silicon substrate.

7. A method according to claim 1, wherein:
annealing the first ferromagnetic metal layer to form a layer of metal silicide and forming a second ferromagnetic layer on the layer of metal silicide forms a drain electrode for receiving spin-polarized carriers from the silicon substrate through the layer of metal silicide.

8. A method according to claim 1, further comprising:
depositing a gate electrode on the silicon substrate, the gate electrode capable of receiving a gate bias and applying an electric field across the silicon substrate such that spin-polarized carriers flowing through the electric field will change spin orientation.

\* \* \* \* \*